United States Patent [19]
Oyama

[11] Patent Number: 5,525,944
[45] Date of Patent: Jun. 11, 1996

[54] LADDER FILTER WITH PIEZORESONATORS AND FOLDED ELECTRODE TERMINALS STACKED IN A CASE

[75] Inventor: Yusei Oyama, Nagaokakyo, Japan

[73] Assignee: Murata Manufacturing Co., Ltd., Japan

[21] Appl. No.: 180,047

[22] Filed: Jan. 11, 1994

[30] Foreign Application Priority Data

Jan. 12, 1993 [JP] Japan .................. 5-003233

[51] Int. Cl.⁶ .......................... H03H 9/10; H03H 9/205; H03H 9/58
[52] U.S. Cl. ............................ 333/189; 310/348
[58] Field of Search ................... 333/189–192; 310/348, 355

[56] References Cited

U.S. PATENT DOCUMENTS 5,260,675  11/1993  Ogawa et al. ................. 333/189
5,272,595  12/1993  Mura et al. ................... 361/772

FOREIGN PATENT DOCUMENTS 68956    6/1978  Japan ................. 333/189
25610    1/1989  Japan ................. 333/189
5145372  6/1993  Japan ................. 333/190

*Primary Examiner*—Benny Lee
*Attorney, Agent, or Firm*—Ostrolenk, Faber, Gerb & Soffen

[57] ABSTRACT

A ladder filter has a terminal which has a first electrode portion and a second electrode portion which is folded back on the first electrode portion, the first electrode portion and the second electrode portion having a first projection and a second projection respectively which are in contact with piezoresonators. The folding position of the second electrode portion and the whole second electrode portion are inside peripheral sides of the piezoresonators. The second projection is lower than the first projection.

8 Claims, 4 Drawing Sheets

LADDER FILTER WITH PIEZORESONATORS AND FOLDED ELECTRODE TERMINALS STACKED IN A CASE

BACKGROUND OF THE INVENTION

1. Field of the Invention

The present invention relates to, a ladder filter, and more particularly, to a ladder filter for use in a communication device, such as a portable telephone or the like.

2. Description of Related Art

A conventional type of ladder filter has a structure wherein piezoresonators and terminals are stacked and contained in a box-type case. At least one of the terminals has a first electrode portion and a second electrode portion which are mutually folded, and the first electrode portion and the second electrode portion each have a projection for supporting a piezoresonator.

A possible way of downsizing the ladder filter is to use a thin plate as the material of the terminals. However, the terminals must have a strength over a certain degree, and the plate must have a thickness which guarantees the strength.

Another way of downsizing the ladder filter is to provide low projections on the first and the second electrode portions. In this case, however, if a piezoresonator is placed in the case in a slanted position, the peripheral portion of the piezoresonator may come into contact with the first and/or the second electrode portions of the terminal. Then, the piezoresonator may be influenced by damping, and the electrical characteristics of the ladder filter may be lowered.

SUMMARY OF THE INVENTION

An object of the present invention is to provide a compact ladder filter, wherein a piezoresonator of the ladder filter is unlikely to come into contact with an electrode of a terminal.

In order to attain the object, a ladder filter according to the present invention comprises a terminal which has a first electrode portion and a second electrode portion, which is folded back on the first electrode portion. The first electrode portion and the second electrode portion have a first projection and a second projection, respectively, which are in contact with a respective one of the piezoresonators. The folding position of the second electrode portion is inside peripheral sides of the piezoresonators, and the whole second electrode portion is inside the peripheral sides of the piezoresonators. Further, the second projection is lower in height than the first projection.

In the structure described above, the sum of the thickness of the second electrode portion and the height of the second projection is the substantial height (the height from the first electrode portion) of the second projection, that is, the second electrode portion acts as part of the substantial height of the second projection. Thereby, the height of the second projection itself can be reduced, and this will not cause a piezoresonator which is supported by the second projection to come into contact with the first and/or the second electrode portions.

BRIEF DESCRIPTION OF THE DRAWINGS

This and other objects and features of the present invention will be apparent from the following description with reference to the accompanying drawings, in which.

DETAILED DESCRIPTION OF THE PREFERRED EMBODIMENTS

An exemplary ladder filter according to the present invention is hereinafter described with reference to the accompanying drawings.

Figure 1:
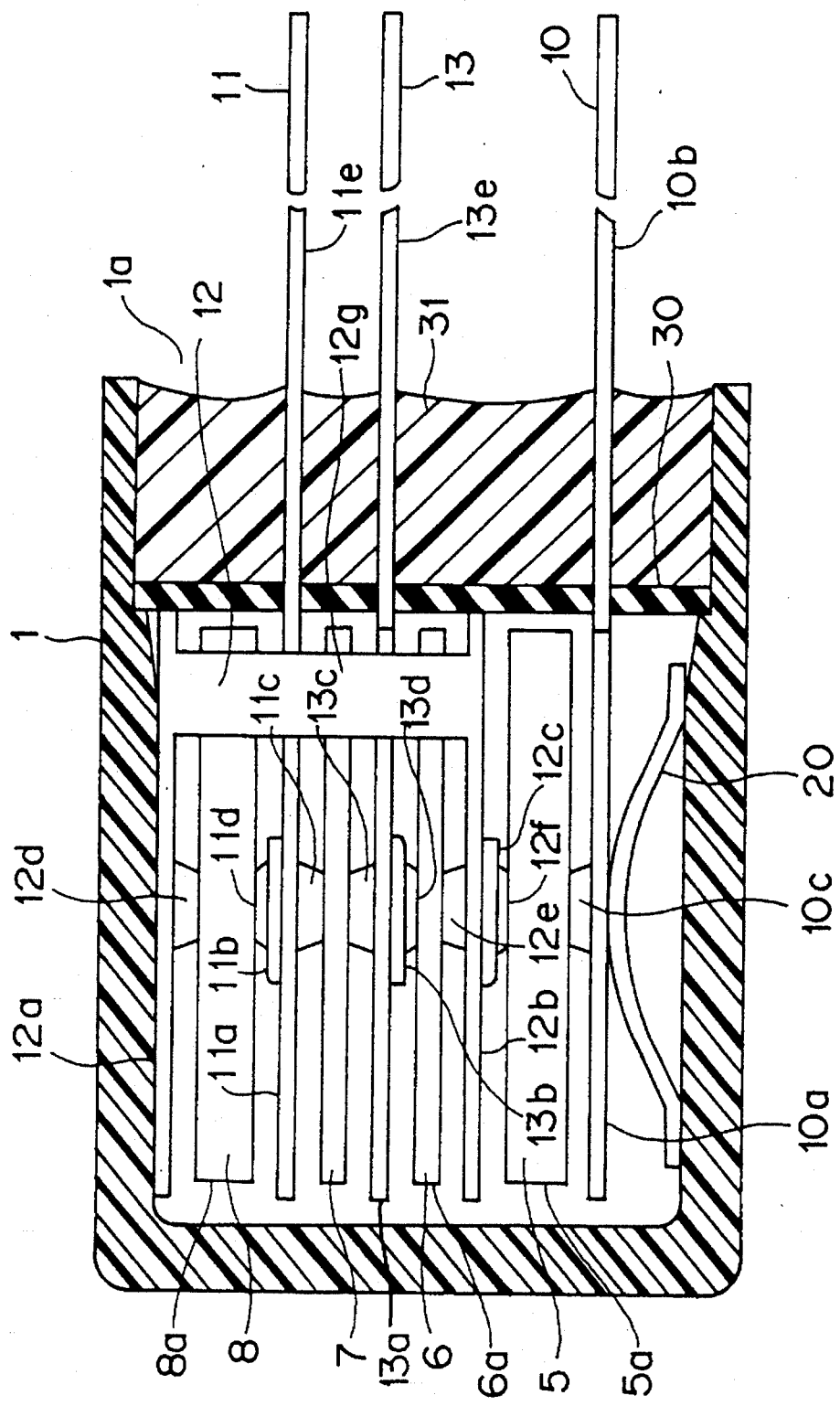
FIG. 1 is a fragmentary sectional view of a ladder filter which is an embodiment of the present invention.

As shown in FIG. 1, the ladder filter comprises a box-type case 1, four piezoresonators 5, 6, 7 and 8, an input terminal 10, an output terminal 11, a relay terminal 12 and a grounding terminal 13. The piezoresonators 5, 6 and 8 include peripherals sides $5a$, $6a$ and $8a$, respectively. The piezoresonators 5, 6, 7 and 8 are of a conventional type which has oscillation electrodes on the front and the back sides and operates in a stretch vibration mode.

The case 1 has an opening $1a$ at the right side of FIG. 1. The case 1 is made of resin, ceramics or the like.

The input terminal 10 has an electrode portion $10a$, a connecting portion $10b$ and a projection $10c$. The projection $10c$ is pressed against the lower surface of the piezoresonator 5. The pressure on the projection $10c$ is generated by the elasticity of a spring member 20 which is provided under the electrode portion $10a$.

Figure 2:
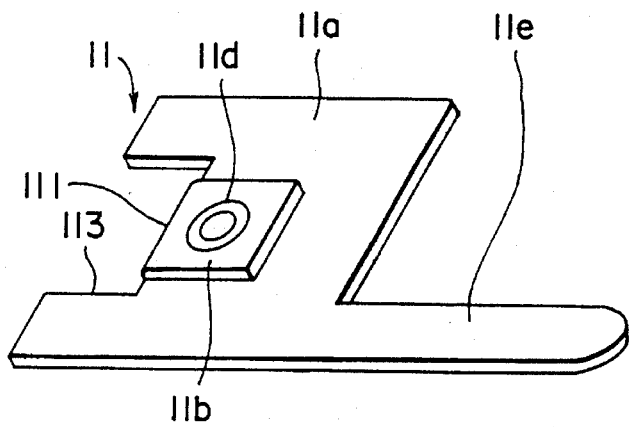
FIG. 2 is a perspective view of an output terminal which is a component of the ladder filter shown in FIG. 1.
Figure 3:
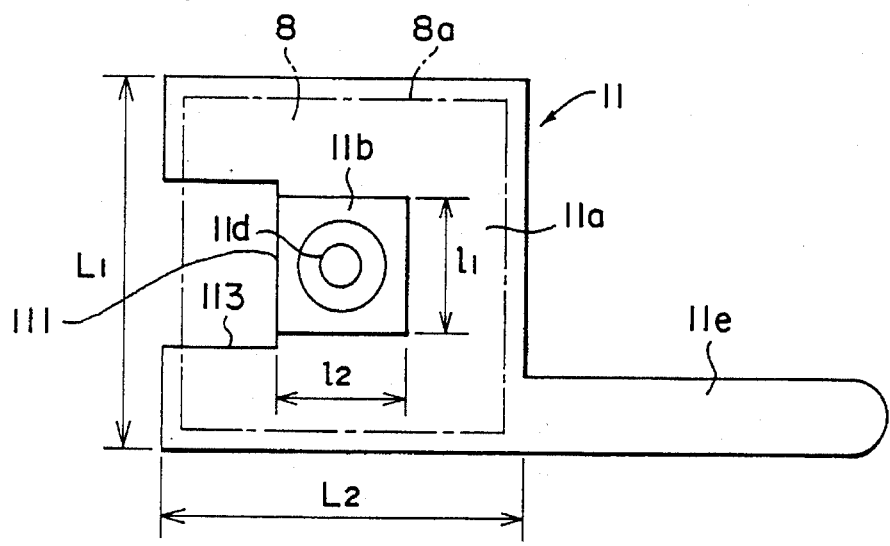
FIG. 3 is a plan view of the output terminal shown FIG. 2.
Figure 4:
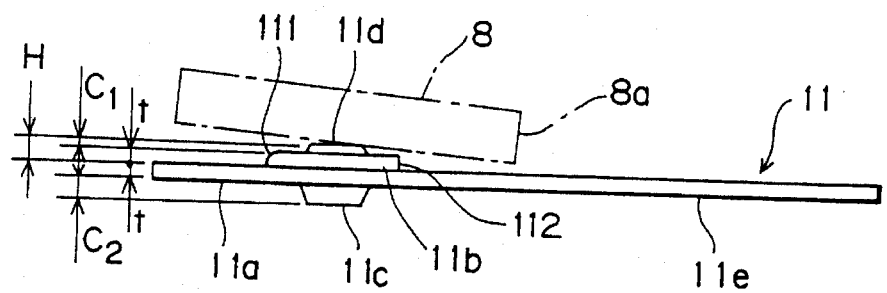
FIG. 4 is a side view of the output terminal shown in FIG. 2.

The output terminal 11 has electrode portions $11a$ and $11b$, projections $11c$ and $11d$, and a connecting portion $11e$. The projections $11c$ and $11d$ are disposed on the electrode portions $11a$ and $11b$, respectively, such that the projection $11c$ is in contact with the upper surface of the piezoresonator 7 and the projection $11d$ is in contact with the lower surface of the piezoresonator 8. As can be seen in FIGS. 2 through 4, the electrode portion $11b$ is folded back on the electrode portion $11a$, and the connecting portion $11e$ extends from the electrode portion $11a$. The folding position 111 is inside peripheral sides $8a$ of the piezoresonator 8, and the whole electrode portion $11b$ is inside the peripheral sides $8a$ of the piezoresonator 8 (see FIGS. 3 and 4). A cutout 113 (see FIGS. 2 and 3) is made in the electrode portion $11a$, and the folding position 111 is at the bottom of the cutout 113.

The output terminal 11 is made of a plate which has a thickness of t (see FIG. 4). The electrode portion $11a$ has dimensions of $L_1$ by $L_2$ and the electrode portion $11b$ has dimensions of $l_1$ by $l_2$ as seen in FIG. 3. The projection lid has a height of $C_1$, and the projection $11c$ has a height of $C_2$ (as seen in FIG. 4) which is larger than $C_1$. The values t, $L_1$, $L_2$, $l_1$, $l_2$ and $C_1$ are set such that the peripheral sides $8a$ of the piezoresonator 8, even if the piezoresonator 8 is held by the projection $11d$ in a slanted position, will not come into contact with peripheral sides 112 (see FIG. 4) of the electrode portion $11b$. In this embodiment, as seen in FIG. 4 the thickness t of the plate of the output terminal 11, the height $C_2$ of the projection 11c and the height $C_1$ of the projection 11d meet the condition: $C_2 = t + C_1$. The addition of the thickness t of the electrode portion 11b and the height $C_1$ of the projection 11d is the substantial height H (the height from the electrode portion 11a as seen in FIG. 4) of the projection 11d, that is, the electrode portion 11b acts as part of the substantial height H of the projection 11d. Conventionally, the projections 11c and 11d have the same height. However, in this embodiment, the height of the projection 11d, which is disposed on the electrode portion 11b with a thickness of t, can be reduced by the thickness t, and this will not cause contact of the piezoresonator 8 with the electrode portions 11a and/or 11b.

Figure 5:
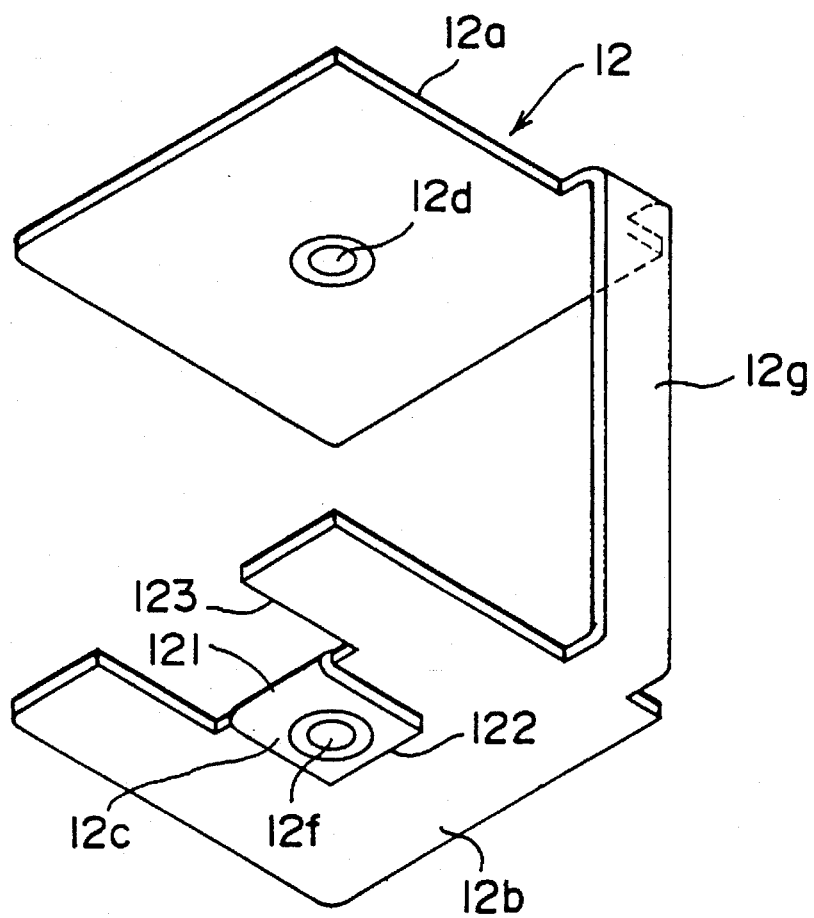
FIG. 5 is a perspective view of a relay terminal which is a component of the ladder filter shown in FIG. 1.

As shown in FIG. 1, the relay terminal 12 has electrode portions 12a, 12b and 12c, projections 12d, 12e and 12f, and a relay portion 12g. The projections 12d, 12e and 12f are disposed on the electrode portions 12a, 12b and 12c, respectively, such that the projection 12d is in contact with the upper surface of the piezoresonator 8, the projection 12e is in contact with the lower surface of the piezoresonator 6 and the projection 12f is in contact with the upper surface of the piezoresonator 5. FIG. 5 shows the relay terminal 12 having the electrode portions 12a, 12b, and 12c, projections 12d, 12e (not shown) and 12f, and a relay portion 12g. As can be seen in FIG. 5, the electrode portion 12c is folded back on electrode portion 12b. The folding position 121 and the electrode portion 12c are inside peripheral sides 5a of the piezoresonator 5. A cutout 123 is made in the electrode the portion 12b, and the folding position 121 is at the bottom of the cutout 123.

Length of the projection 12f is less than the projection 12e. As seen in FIG. 1, the measurements of the electrode portions 12b and 12c are set such that the peripheral sides 5a of the piezoresonator 5, even if the piezoresonator 5 is held by the projection 12f on a slant, will not come into contact with peripheral sides 122 (see FIG. 5) of the electrode portion 12c. In this embodiment, the addition of the height of the projection 12f and the thickness of the plate of the relay terminal 12 is the height of the projection 12e. Thereby, the addition of the thickness of the electrode portion 12c and the height of the projection 12f is the substantial height H (the height from the electrode portion 12b) of the projection 12f, that is, the electrode portion 12c acts as part of the substantial height H of the projection 12f. Thus, the projection 12f can be made lower in height than the projection 12e, and this will not cause contact of the piezoresonator 5 with the electrode portions 12b and/or 12c.

Figure 6:
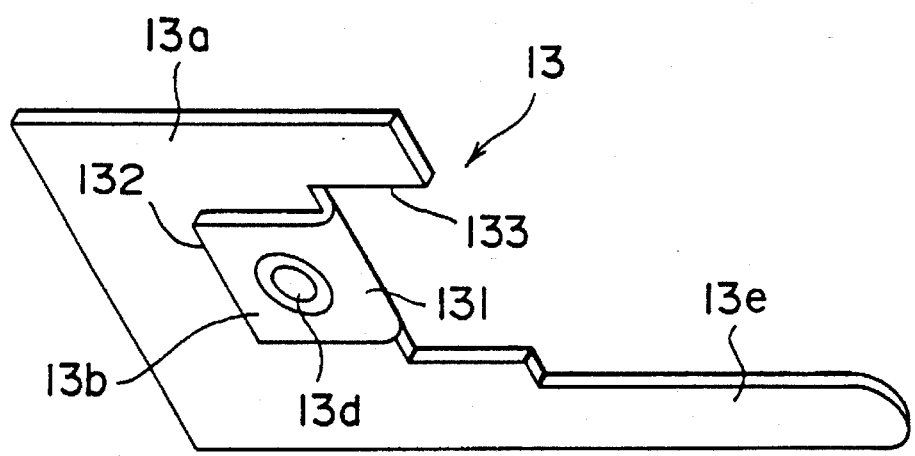
FIG. 6 is a perspective view of a grounding terminal which is a component of the ladder filter shown in FIG. 1.

As shown in FIG. 1, the grounding terminal 13 has electrode portions 13a and 13b, projections 13c and 13d, and a connecting portion 13e. The projections 13c and 13d are disposed on the electrode portions 13a and 13b respectively such that the projection 13c is in contact with the lower surface of the piezoresonator 7 and the projection 13d is in contact with the upper surface of the piezoresonator 6. FIG. 6 shows the grounding terminal 13 having projection 13d and the connecting portion 13e. As can be seen in FIG. 6, the electrode portion 13b is folded back on the electrode portion 13a. The folding position 131 and the electrode portion, 13b are inside peripheral sides 6a (see FIG. 1) of the piezoresonator 6. A cutout 133 is made in the electrode portion 13a, and the folding position 131 is at the bottom of the cutout 133.

As seen in FIG. 1, the height of the projection 13d is less than the that of projection 13c. The measurements of the electrode portions 13a and 13b are set such that the peripheral sides 6a of the piezoresonator 6, even if the piezoresonator 6 is held by the projection 13d on a slant, will not come into contact with peripheral sides 132 of the electrode portions 13b. In this embodiment, the addition of the height of the projection 13d and the thickness of the plate of the grounding terminal 13 is equal to the height of the projection 13c. Thereby, the addition of the thickness of the electrode portion 13b and the height of the projection 13d is the substantial height H (the height from the electrode portion 13a) of the projection 13d, that can be, the electrode portion 13b acts as part of the substantial height H of the projection 13d. Thus, the projection 13d is made lower than the projection 13c, and this will not cause contact of the piezoresonator 6 with the electrode portions 13a and/or 13b.

As seen in FIG. 1, the piezoresonators 5 through 8 and the terminals 10 through 13 are inserted into the case 1 via the opening 1a. Then, an insulating sheet 30 is set on a step made in the opening 1a. A sealing material 31 such as resin is potted in the opening 1a so as to seal the case 1. Further, the connecting portions 10b, 11e, 13e of the terminals 10, 11 and 13, respectively, may be bent after hardening of the sealing material 31 so as to finish the ladder filter as a surface mounting type.

The ladder filter obtained in this way is smaller than a conventional one because the projections 11d, 12f and 13d of the terminals 11, 12 and 13, respectively, are lower than those of the conventional one.

Figure 7:
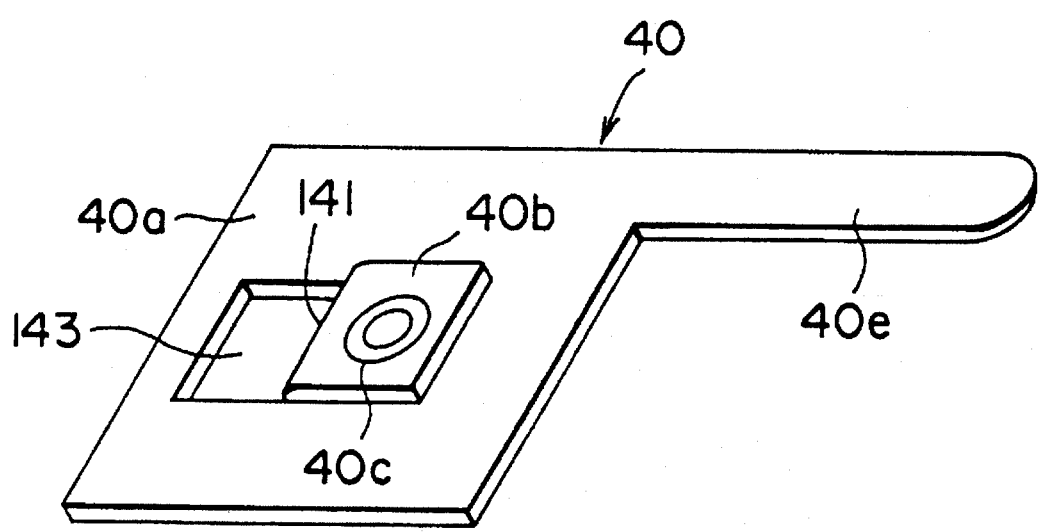
FIG. 7 is a perspective view of a modification of a terminal to be employed in a ladder filter.

In the present invention, the terminals may have any other configuration. A terminal 40 illustrated in FIG. 7 is an example. The terminal 40 has electrode portions 40a and 40b, two projections 40c (only one of them is shown), and a connecting portion 40e. The electrode portion 40b is folded back on the electrode portion 40a. A hole 143 is made in the electrode portion 40a, and the folding position 141 is at the edge of the hole 143.

Although the present invention has been described in connection with the preferred embodiment, it is to be noted that various changes and modifications are possible to those who are skilled in the art. Such changes and modifications are to be understood as being within the scope of the invention.

What is claimed is:

1. A ladder filter comprising:

a case;

a plurality of piezoresonators contained-in the case; and at least one terminal structured and arranged for supporting the piezoresonators in the case, the terminal having a first electrode portion, and a second electrode portion which overlays the first electrode portion, the first electrode portion and the second electrode portion having a first projection and a second projection, respectively, each projection having a top portion in contact with a respective one of the piezoresonators, and a respective height defined by a distance of the top portion of the projection from a surface of the corresponding electrode portion;

wherein a cutout is provided in the first electrode portion to extend inwardly from a peripheral edge of the first electrode portion, the second electrode portion extends from an inner bottom end of the cutout and is located inside a region defined by peripheral sides of the piezoresonators, and the height of the second projection is less than the height of the first projection.

2. A ladder filter as claimed in claim 1, wherein the height of the first projection is $C_2$, the height of the second projection is $C_1$ and the second electrode portion has a thickness of t, arid the values $C_1$, $C_2$ and t meet the following condition:

$$C_2 = t + C_1.$$

3. A ladder filter as claimed in claim 1, wherein:

the terminal further has a connecting portion that extends from the first electrode portion; and the terminal is fixed to the case by the connecting portion.

4. A ladder filter as claimed in claim 1, wherein:

the terminal further has a third electrode portion which is connected with the first electrode portion by a relay portion; and the third electrode portion has a third projection which is in contact with one of said plurality of piezoresonators other than the respective piezoresonators which are in contact with the first projection of the first electrode portion and the second projection of the second electrode portion.

5. A ladder filter comprising:

a case;

a plurality of piezoresonators contained in the case; and at least one terminal structured and arranged for supporting the piezoresonators in the case, the terminal having a first electrode portion, and a second electrode portion which overlays the first electrode portion and is connected to the first electrode portion at a folding position, therebetween the first electrode portion and the second electrode portion having a first projection and a second projection, respectively, each projection having a top portion in contact with a respective one of the piezoresonators, and a respective height defined by a distance of the top portion of the projection from a surface of the corresponding electrode portion, wherein a hole is provided in the first electrode portion and the folding position is at an edge of the hole, the second electrode portion extends from the folding position at the edge of the hole and is located inside a region defined by peripheral sides of the piezoresonators, and the height of the second projection is less than the height of the first projection.

6. A ladder filter as claimed in claim 5, wherein:

the terminal further has a connecting portion that extends from the first electrode portion; and the terminal is fixed to the case by the connecting portion.

7. A ladder filter comprising:

a case;

a plurality of piezoresonators contained in the case; and at least one terminal structured and arranged for supporting the piezoresonators in the case, the terminal having a first electrode portion: and a second electrode portion which overlays the first electrode portion, the first electrode portion and the second electrode portion having a first projection and a second projection, respectively, each projection having a top portion in contact with a respective one of the piezoresonators, and a respective height defined by a distance of the top portion of the projection from a surface of the corresponding electrode portion, wherein a hole is provided in the first electrode portion, the second electrode portion extends from an edge of the hole and is located inside region defined by peripheral sides of the piezoresonators, the height of the second projection is less than the height of the first projection;

the terminal further has a third electrode portion which is connected with the first electrode portion by a relay portion; and the third electrode portion has a third projection which is in contact with one of said plurality of piezoresonators other than the respective piezoresonators which are in contact with the first projection of the first electrode portion and the second projection of the second electrode portion.

8. A ladder filter comprising:

a case;

a plurality of piezoresonators contained in the case; and at least one terminal structured and arranged for supporting the piezoresonator in the case, the terminal having a first electrode portion, and a second electrode portion which overlays the first electrode portion, the first electrode portion and the second electrode portion having a first protection and a second projection, respectively, each projection having a top portion in contact with a respective one of the piezoresonator, and a respective height defined by a distance of the top portion of the projection from surface of the corresponding electrode portion, wherein a hole is provided in the first electrode portion, the second electrode portion extends from an edge of the hole and is located inside a region define by peripheral sides of the piezoresonators, the height of the second projection is less than the height of the first projection, and the height of the first projection is $C_2$, the height of the second projection is $C_1$ and the second electrode portion has a thickness of t, and the values $C_1$, $C_2$ and t meet the following condition:

$$C_2 = t + C_1.$$

* * * * *